United States Patent
Han et al.

(10) Patent No.: US 11,049,889 B2
(45) Date of Patent: Jun. 29, 2021

(54) METHOD FOR PREPARING ARRAY SUBSTRATE BY STRIPPING FIRST PHOTO-RESIST LAYER THROUGH WET ETCHING BEFORE FORMING OHM CONTACT LAYER AND ACTIVE LAYER

(71) Applicants: Beijing BOE Display Technology Co., Ltd., Beijing (CN); BOE Technology Group Co., Ltd., Beijing (CN)

(72) Inventors: Xiao Han, Beijing (CN); Jinchao Bai, Beijing (CN); Xiangqian Ding, Beijing (CN); Huibin Guo, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 247 days.

(21) Appl. No.: 16/332,882

(22) PCT Filed: Sep. 21, 2018

(86) PCT No.: PCT/CN2018/107092
§ 371 (c)(1),
(2) Date: Mar. 13, 2019

(87) PCT Pub. No.: WO2019/109712
PCT Pub. Date: Jun. 13, 2019

(65) Prior Publication Data
US 2021/0028200 A1    Jan. 28, 2021

(30) Foreign Application Priority Data
Dec. 6, 2017   (CN) .......................... 201711277247.8

(51) Int. Cl.
*H01L 27/12*       (2006.01)
*G02F 1/1343*      (2006.01)
(Continued)

(52) U.S. Cl.
CPC ........ *H01L 27/1288* (2013.01); *G02F 1/1368* (2013.01); *G02F 1/13439* (2013.01);
(Continued)

(58) Field of Classification Search
CPC ............... H01L 27/3248; H01L 27/124; H01L 27/1259; H01L 27/1288; H01L 29/78669;
(Continued)

(56) References Cited

U.S. PATENT DOCUMENTS

2004/0222421 A1    11/2004 Lee et al.
2006/0038957 A1     2/2006 Lee et al.
(Continued)

FOREIGN PATENT DOCUMENTS

CN         1551367 A       12/2004
CN       101188242 A        5/2008
(Continued)

OTHER PUBLICATIONS

International Search Report for PCT/CN2018/107092 dated Dec. 27, 2018.
(Continued)

*Primary Examiner* — Scott B Geyer
(74) *Attorney, Agent, or Firm* — Arent Fox LLP; Michael Fainberg (57) ABSTRACT

This disclosure provides an array substrate, a method for fabricating the same, a display panel, and a display device, where a first photo-resist layer is stripped in a changed order in that the first photo-resist layer on a source-drain is stripped through wet etching before a ohm contact layer film and an active layer film are etched in an electrically-conductive channel area (i.e., an electrically-conductive channel of a TFT is etched) to form an ohm contact layer and an active layer.

7 Claims, 7 Drawing Sheets

(51) Int. Cl.
*G02F 1/1368* (2006.01)
*H01L 21/3065* (2006.01)
*H01L 21/308* (2006.01)
*H01L 21/3213* (2006.01)

(52) U.S. Cl.
CPC ...... *H01L 27/124* (2013.01); *G02F 1/134363* (2013.01); *H01L 21/3065* (2013.01); *H01L 21/3085* (2013.01); *H01L 21/32133* (2013.01); *H01L 21/32139* (2013.01)

(58) Field of Classification Search
CPC ......... H01L 29/78678; H01L 29/66765; H01L 29/78648; H01L 29/45–458
See application file for complete search history.

(56) References Cited

U.S. PATENT DOCUMENTS

| | | | |
|---|---|---|---|
| 2008/0164471 | A1 | 7/2008 | Choung et al. |
| 2009/0191414 | A1 | 7/2009 | Sekiba |
| 2010/0155733 | A1 | 6/2010 | Moon et al. |
| 2011/0273639 | A1 | 11/2011 | Xie et al. |
| 2012/0315715 | A1 | 12/2012 | Cho et al. |
| 2012/0318769 | A1* | 12/2012 | Choung ............ H01L 21/32134 216/13 |
| 2014/0138685 | A1* | 5/2014 | Zhang ............... H01L 29/78669 257/48 |
| 2016/0247828 | A1 | 8/2016 | Wang |
| 2017/0162708 | A1* | 6/2017 | Ge .................... H01L 29/78648 |

FOREIGN PATENT DOCUMENTS

| | | |
|---|---|---|
| CN | 101273106 A | 9/2008 |
| CN | 102237305 A | 11/2011 |
| CN | 102819156 A1 | 12/2012 |
| CN | 104091784 A | 10/2014 |
| CN | 104241139 A | 12/2014 |
| CN | 104766859 A | 7/2015 |
| CN | 108010924 A | 5/2018 |

OTHER PUBLICATIONS

Chinese Office Action for corresponding application 201711277247.8 dated Nov. 26, 2019.

Chinese Office Action for corresponding application 201711277247.8 dated May 11, 2020.

* cited by examiner

METHOD FOR PREPARING ARRAY SUBSTRATE BY STRIPPING FIRST PHOTO-RESIST LAYER THROUGH WET ETCHING BEFORE FORMING OHM CONTACT LAYER AND ACTIVE LAYER

This application is a National Stage of International Application No. PCT/CN2018/107092, filed on Sep. 21, 2018, which claims the priority of Chinese Patent Application No. 201711277247.8, filed with the Chinese Patent Office on Dec. 6, 2017, and entitled "An array substrate, a method for fabricating the same, and a display panel", both of which are hereby incorporated by reference in their entireties.

FIELD

This disclosure relates to the field of display technologies, and particularly to an array substrate, a method for fabricating the same, and a display panel, and a display device.

BACKGROUND

Among flat panel display devices, a Thin Film Transistor Liquid Crystal Display (TFT-LCD) has become predominant in the market of flat panel displays due to a small volume, low power consumption, a low fabrication cost, no radiation, and other characteristics thereof.

SUMMARY

A method for fabricating an array substrate according to an embodiment of this disclosure includes:
  forming a gate, a gate insulation layer, an active layer film, an ohm contact layer film, and a Cu layer on a base substrate successively;
  forming a first photo-resist layer on the Cu layer, and patterning the first photo-resist layer to form a first photo-resist pattern;
  etching the Cu layer, the ohm contact layer film, and the active layer film using the first photo-resist pattern to form a source-drain at the Cu layer, and to remove patterns other than patterns corresponding to the source-drain and an electrically-conductive channel area, at the ohm contact layer film and the active layer film;
  stripping the first photo-resist layer through a wet etching;
  forming a pixel electrode in partial contact with the source-drain from which the first photo-resist layer is stripped, on the source-drain; and
  etching the ohm contact layer film and the active layer film in the electrically-conductive channel area by using the source-drain as a shelter, to form an ohm contact layer and an active layer.

Optionally, the etching the Cu layer, the ohm contact layer film, and the active layer film using the first photo-resist pattern includes:
  performing a first wet etching on the Cu layer by using the first photo-resist pattern as a shelter, to remove the pattern other than patterns corresponding to the source-drain and the electrically-conductive channel area, at the Cu layer;
  performing a first dry etching on the ohm contact layer film and the active layer film by using the first photo-resist pattern as a shelter, to remove the patterns other than patterns corresponding to the source-drain and the electrically-conductive channel area, at the ohm contact layer film and the active layer film;
  thinning the first photo-resist pattern to remove the first photo-resist pattern in the electrically-conductive channel area; and
  performing a second wet etching on the Cu layer by using the thinned first photo-resist pattern as a shelter, to remove the pattern of the Cu layer corresponding to the electrically-conductive channel area to form the source-drain.

Optionally, the etching the ohm contact layer film and the active layer film in the electrically-conductive channel area includes:
  performing a second dry etching on the ohm contact layer film and the active layer film to remove the patterns other than patterns corresponding to the electrically-conductive channel area, at the ohm contact layer film and the active layer film.

Optionally, the forming the pixel electrode in partially contact with the source-drain from which the first photo-resist layer is stripped, on the source-drain includes:
  forming a transparent electrode layer on the source-drain from which the first photo-resist layer is striped;
  forming a second photo-resist layer on the transparent electrode layer, and patterning the second photo-resist layer to form a second photo-resist pattern;
  etching the transparent electrode layer using the second photo-resist layer to form a pixel electrode; and
  stripping the second photo-resist layer on the pixel electrode.

Optionally, after the ohm contact layer and the active layer are formed, the method further includes:
  forming a passivation layer on the pixel electrode.

Optionally, the method further includes:
  forming a common electrode on the passivation layer.

Optionally, before the gate is formed, the method further includes:
  forming a common electrode on the base substrate.

An embodiment of this disclosure further provides an array substrate fabricating using the method above, the array substrate including:
  a base substrate;
  a gate on the base substrate;
  a gate insulation layer covering the gate on the base substrate;
  an active layer on the gate insulation layer;
  an ohm contact layer on the active layer;
  a source-drain located on the ohm contact layer, and made of Cu; and
  a pixel electrode on the source-drain, and in partially contact with the source-drain.

Optionally, the array substrate further includes: a passivation layer on the pixel electrode.

Optionally, the array substrate further includes: a common electrode on the passivation layer.

Optionally, the array substrate further includes: a common electrode at a layer same as a layer at which the gate is.

An embodiment of this disclosure further provides a display panel including the array substrate according to any one of the embodiments above of this disclosure.

An embodiment of this disclosure further provides a display device including the display panel according to the embodiment above of this disclosure.

DETAILED DESCRIPTION OF THE EMBODIMENTS

At present, an active layer, and a source-drain in an array substrate of a TFT-LCD are typically fabricated using the same mask in the steps of: (1) forming a gate, a gate insulation layer, an active layer film, an ohm contact layer film, and a source and drain film on a base substrate; (2) applying photo-resist (PR) on the source and drain film, exposing the photo-resist using a half-tone mask, and then exposing the photo-resist; (3) performing first wet etching on the source and drain film, and first dry etching on the ohm contact layer film and the active layer film in sequence according to the developed photo-resist; (4) thinning the photo-resist to remove the photo-resist in an electrically-conductive channel area, and performing second wet etching on the source and drain layer film, and second dry etching on the ohm contact layer film and the active layer film to form the active layer, an ohm contact layer, and the source-drain; (5) stripping the photo-resist on the source-drain; and (6) forming a passivation layer and a pixel electrode in sequence on the source-drain from which the photo-resist is stripped, where the pixel electrode is electrically connected with the drain through a through-hole on the passivation layer.

In the array substrate fabricated using the process steps above, the source and drain film is typically an Al film, and since there is a lower resistivity of Cu than Al, in order to improve an opening ratio of a pixel, the source and drain film is made of Cu in the prior art. If the photo-resist on the source-drain is stripped through wet etching in the step (5) above, then diffusible Cu ions will be diffused into the electrically-conductive channel area of a TFT along with stripping liquid, and thus contaminate the electrically-conductive channel area of the TFT. In order to prevent the Cu ions from contaminating the electrically-conductive channel area of the TFT, the photo-resist on the source-drain is stripped through dry etching, but dry etching will take a longer length of time, and lower a production throughput, and the surface of the Cu film will be easily oxidized into CuO during dry etching. Moreover the drain will easily come into poor contact with the pixel electrode due to a significant difference in resistivity between Cu and CuO.

In order to avoid the Cu ions from contaminating the electrically-conductive channel area of the TFT, but also the surface of the Cu film at the interface between the source-drain and the pixel electrode from being oxidized, the embodiments of this disclosure provides an array substrate, a method for fabricating the same, a display panel, and a display device.

The technical solutions according to the embodiments of this disclosure will be described below clearly and fully with reference to the drawings in the embodiments of this disclosure, and apparently the embodiments to be described below are only a part but not all of the embodiments of this disclosure. Based upon the embodiments here of this disclosure, all the other embodiments which can occur to those ordinarily skilled in the art without any inventive effort shall fall into the scope of this disclosure.

It shall be noted that the thicknesses and the shapes of respective layers in the drawings of this disclosure are not intended to reflect any real proportion, but only intended to illustrate the disclosure.

Figure 1:
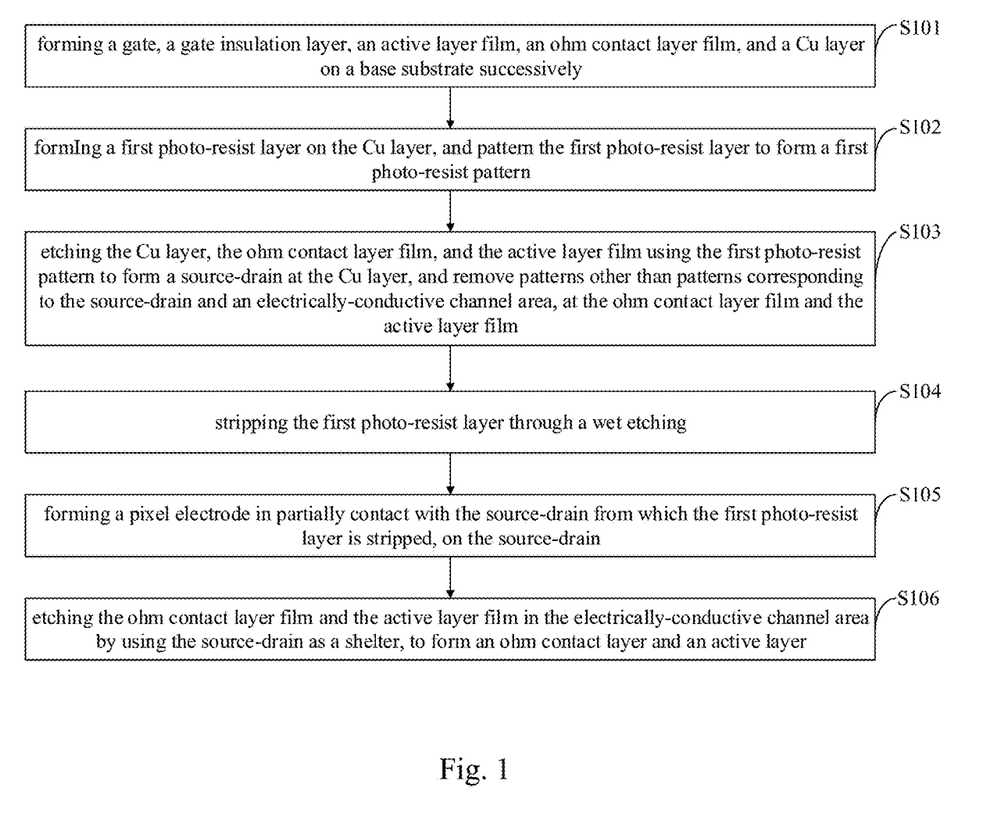
FIG. 1 is a schematic flow chat of a method for fabricating an array substrate according to some embodiments of this disclosure.

Referring to FIG. 1, a method for fabricating an array substrate according to an embodiment of this disclosure particularly includes the following steps.

The step S101 is to form a gate, a gate insulation layer, an active layer film, an ohm contact layer film, and a Cu layer on a base substrate successively.

The step S102 is to form a first photo-resist layer on the Cu layer, and to pattern the first photo-resist layer to form a first photo-resist pattern.

The step S103 is to etch the Cu layer, the ohm contact layer film, and the active layer film using the first photo-resist pattern to form a source-drain at the Cu layer, and to remove patterns other than corresponding to the source-drain and an electrically-conductive channel area, at the ohm contact layer film and the active layer film.

The step S104 is to strip the first photo-resist layer through wet etching.

The step S105 is to form a pixel electrode in partial contact with the source-drain from which the first photo-resist layer is stripped, on the source-drain.

The step S106 is to etch the ohm contact layer film and the active layer film in the electrically-conductive channel area while being shielded by the source-drain, to form an ohm contact layer and an active layer.

Optionally, in the fabricating method above according to the embodiment of the disclosure, the first photo-resist layer is stripped in a changed order in that the first photo-resist layer on the source-drain is stripped through wet etching in the step S104 before the ohm contact layer film and the active layer film are etched in the electrically-conductive channel area (i.e., an electrically-conductive channel of a TFT is etched) in the step S106 to form the ohm contact layer and the active layer, so that the electrically-conductive channel area is formed after stripping through wet etching to thereby avoid Cu ions from contaminating the electrically-conductive channel area of the TFT during stripping through wet etching. Furthermore as compared with stripping the first photo-resist layer on the source-drain through dry etching, the production throughput can be improved, and the surface of the Cu film at the interface between the source-drain and the pixel electrode can be avoided from being oxidized.

Optionally, in the fabricating method above according to the embodiment of the disclosure, the step S103 of etching the Cu layer, the ohm contact layer film, and the active layer film using the first photo-resist pattern can particularly include:

performing a first wet etching on the Cu layer while by using the first photo-resist pattern as a shelter, to remove the pattern other than corresponding to the source-drain and the electrically-conductive channel area, at the Cu layer;

performing first dry etching on the ohm contact layer film and the active layer film by using the first photo-resist pattern as a shelter, to remove the patterns other than corresponding to the source-drain and the electrically-conductive channel area, at the ohm contact layer film and the active layer film;

thinning the first photo-resist pattern to remove the first photo-resist pattern in the electrically-conductive channel area; and performing a second wet etching on the Cu layer by using the thinned first photo-resist pattern as a shelter, to remove the pattern of the Cu layer corresponding to the electrically-conductive channel area to form the source-drain.

Optionally, in the fabricating method above according to the embodiment of the disclosure, the step S106 of etching the ohm contact layer film and the active layer film in the electrically-conductive channel area can optionally include:

performing a second dry etching on the ohm contact layer film and the active layer film to remove the patterns other than corresponding to the electrically-conductive channel area, at the ohm contact layer film and the active layer film.

Optionally, in the fabricating method above according to the embodiment of the disclosure, the step S105 of forming the pixel electrode in partial contact with the source-drain from which the first photo-resist layer is stripped, on the source-drain can particularly include:

forming a transparent electrode layer on the source-drain from which the first photo-resist layer is striped, where the transparent electrode layer can be indium tin oxide (ITO) layer, for example, although the embodiment of this disclosure will not be limited thereto;

forming a second photo-resist layer on the transparent electrode layer, and patterning the second photo-resist layer to form a second photo-resist pattern;

etching the transparent electrode layer using the second photo-resist layer to form a pixel electrode; and stripping the second photo-resist layer on the pixel electrode.

Optionally, in the fabricating method above according to the embodiment of the disclosure, in order to protect elements on the array substrate, after the ohm contact layer and the active layer are formed, the method can further include:

forming a passivation layer on the pixel electrode, where the passivation layer can protect a TFT element and the pixel electrode, both of which are covered therewith.

Figure 2:
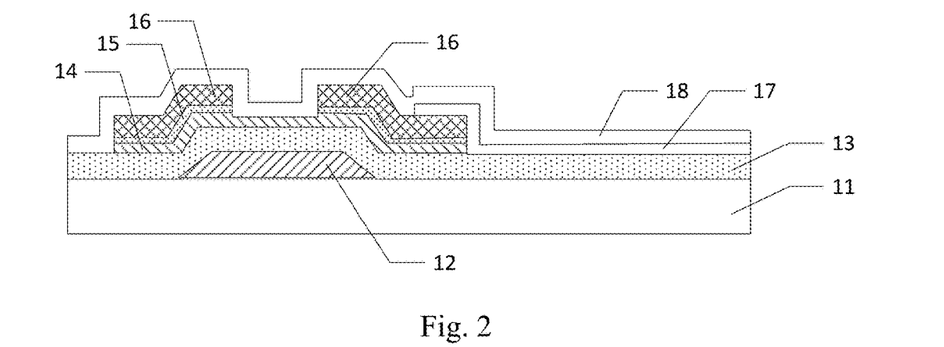
FIG. 2 is a schematic structural diagram of an array substrate according to some embodiments of this disclosure.

Based upon the same inventive idea, an embodiment of this disclosure further provides an array substrate as illustrated in FIG. 2, which is fabricated using the method for fabricating an array substrate according to the embodiment of this disclosure, where the array substrate includes:

a base substrate 11;
a gate 12 located on the base substrate 11;
a gate insulation layer 13 located on the base substrate 11, and covering the gate 12;
an active layer 14 located on the gate insulation layer 13;
an ohm contact layer 15 located on the active layer 14;
a source-drain 16 located on the ohm contact layer 15, and made of Cu; and
a pixel electrode 17 located on the source-drain 16, and in partial contact with the source-drain 16.

Optionally, the display panel including the array substrate above can be an LCD display panel in a Twisted Nematic (TN) mode, for example.

Optionally, as illustrated in FIG. 2, the array substrate above according to the embodiment of this disclosure can further include: a passivation layer 18 located on the pixel electrode 17.

Figure 4:
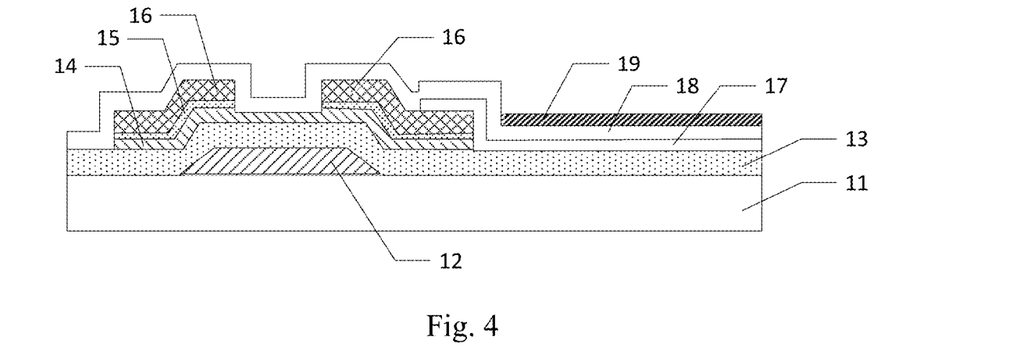
FIG. 4 is another schematic structural diagram of the array substrate according to some embodiments of this disclosure are performed.

Optionally, as illustrated in FIG. 4, the array substrate above according to the embodiment of this disclosure can further include: a common electrode 19 located on the passivation layer 18.

Optionally, the display panel including the array substrate above can be an LCD display panel in an Advanced Super Dimension Switching (ADS) mode, for example.

Figure 5:
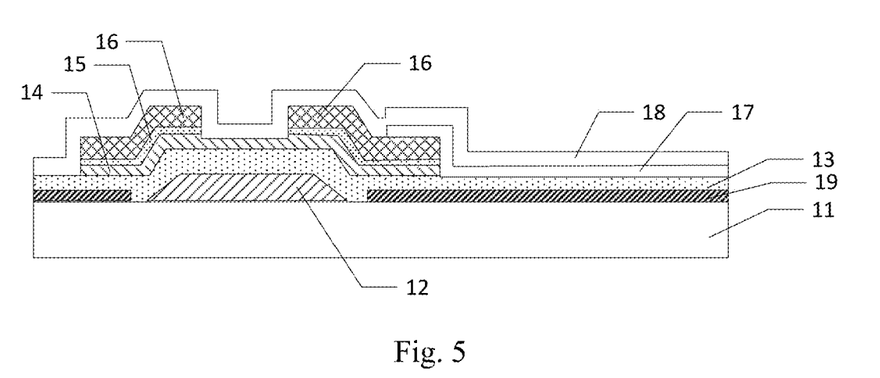
FIG. 5 is another schematic structural diagram of the array substrate according to some embodiments of this disclosure are performed.

Optionally, as illustrated in FIG. 5, the array substrate above according to the embodiment of this disclosure can further include: a common electrode 19 arranged at the same layer as the gate 12.

Optionally, the display panel including the array substrate above can be an LCD display panel in an Advanced Super Dimension Switching (ADS) mode, for example.

The flow of the process of fabricating the array substrate according to the embodiment of the disclosure will be described below in details with reference to FIG. 3A to FIG. 3I taking the array substrate as illustrated in FIG. 2 as an example.

Figure 3A:
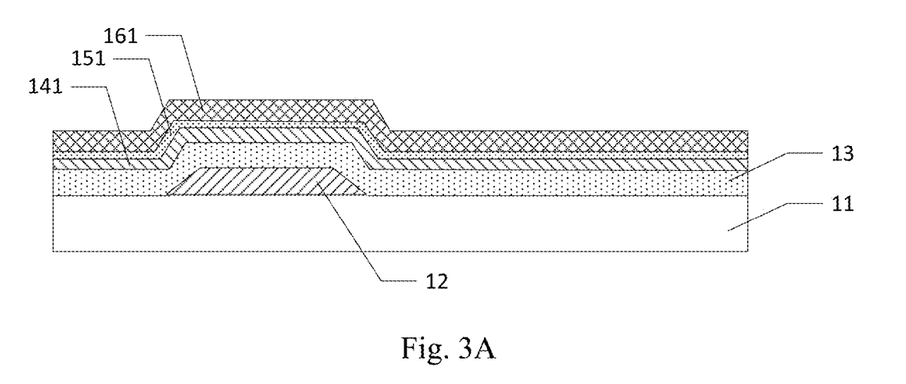
FIG. 3A to FIG. 3I are schematic structural diagrams after respective steps in a flow of a process of fabricating the array substrate according to some embodiments of this disclosure are performed.

The first step is to form a gate 12, a gate insulation layer 13, an active layer film 141, an ohm contact layer film 151, and a Cu film 161 on a base substrate 11 successively as illustrated in FIG. 3A.

Figure 3B:
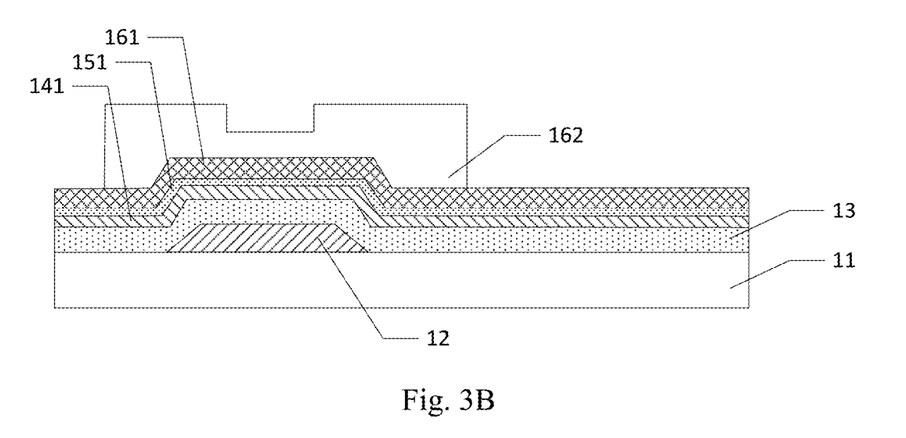

The second step is to form a first photo-resist layer on the Cu film 161, and to pattern the first photo-resist layer to form a first photo-resist pattern 162 as illustrated in FIG. 3B.

Figure 3C:
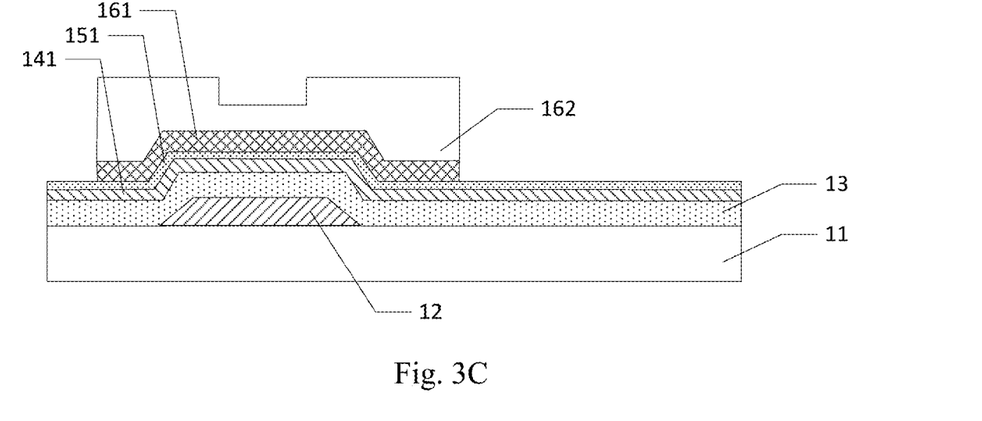

The third step is to perform first wet etching on the Cu film 161 while being shielded by the first photo-resist pattern 162, to remove patterns other than corresponding to a source-drain and an electrically-conductive channel area at the Cu film 161 as illustrated in FIG. 3C.

Figure 3D:
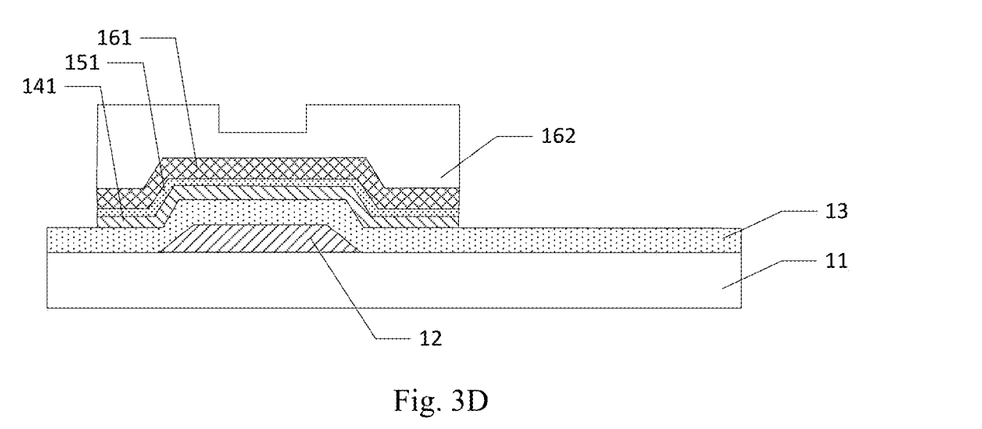

The fourth step is to perform first dry etching on the ohm contact layer film 151 and the active layer film 141 while being shielded by the first photo-resist pattern 162, to remove patterns other than corresponding to the source-drain and the electrically-conductive channel area at the ohm contact layer film 151 and the active layer film 141 as illustrated in FIG. 3D.

Figure 3E:
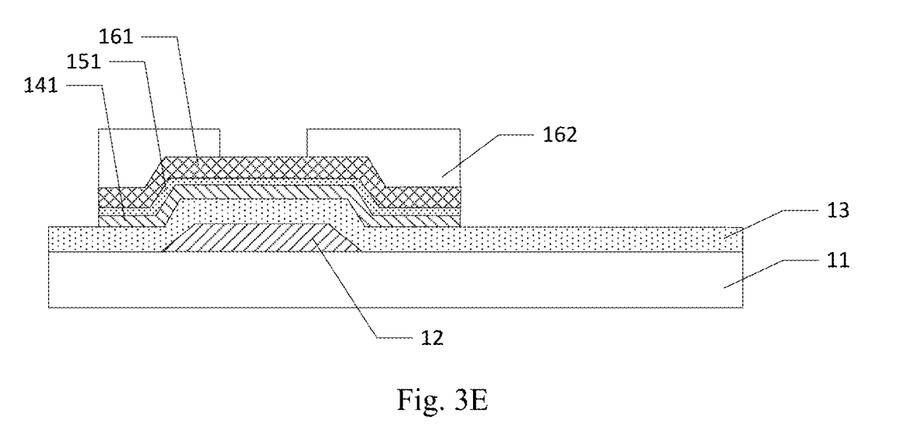

The fifth step is to thin the first photo-resist pattern 162 to remove the pattern of the first photo-resist pattern 162 in the electrically-conductive channel area as illustrated in FIG. 3E.

Figure 3F:
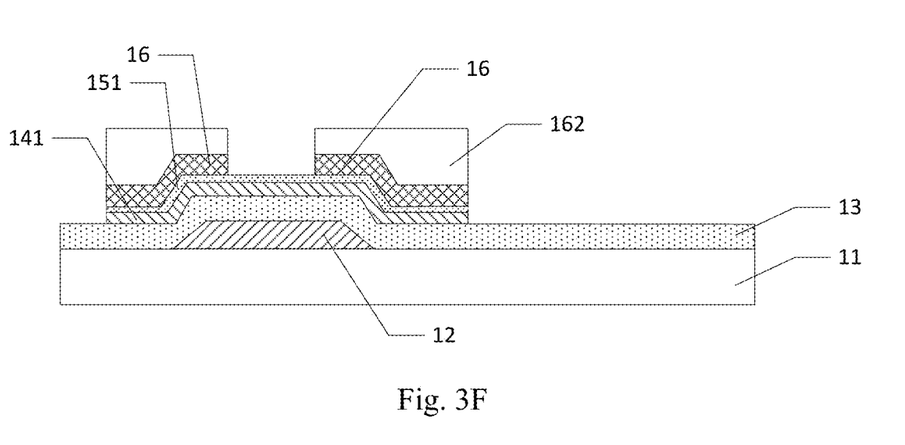

The sixth step is to perform second wet etching on the Cu film 161 while being shielded by the thinned first photo-resist pattern 162, to remove a pattern of the Cu film 161 in the electrically-conductive channel area to form the source-drain 16 as illustrated in FIG. 3F.

Figure 3G:
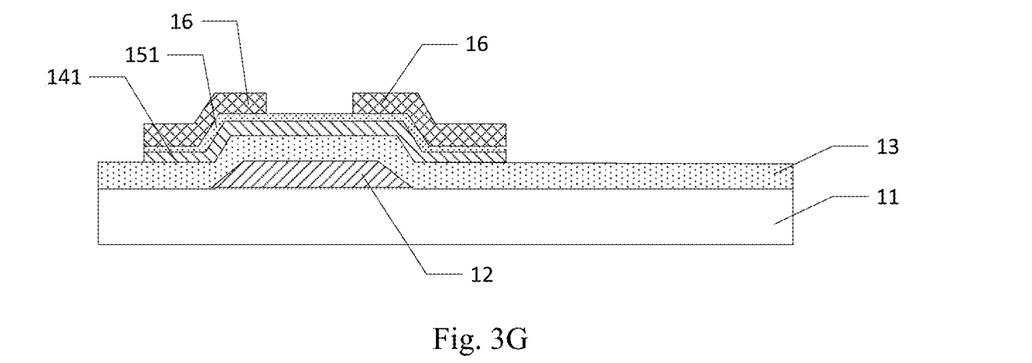

The seventh step is to strip the first photo-resist pattern 162 on the source-drain 16 through wet etching as illustrated in FIG. 3G.

Figure 3H:
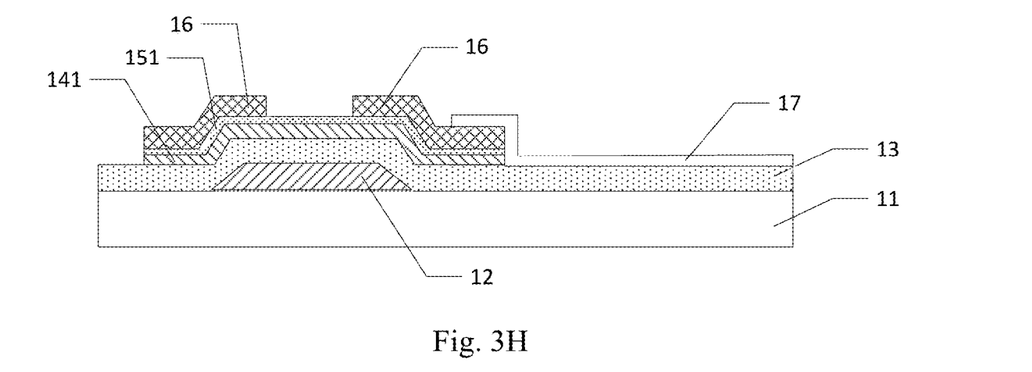

The eighth step is to form a pixel electrode 17 in partial contact with the source-drain 16, on the source-drain 16 from which the first photo-resist pattern 162 is stripped as illustrated in FIG. 3H.

Figure 3I:
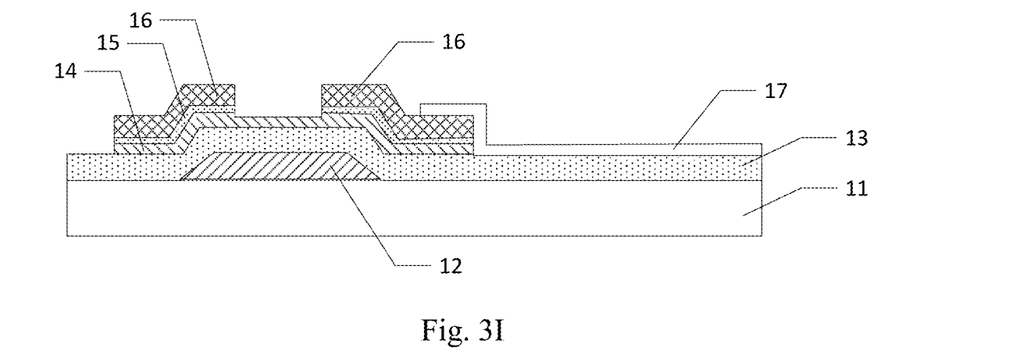

The ninth step is to perform second dry etching on the ohm contact layer film 151 and the active layer film 141 using the source-drain 16 as a mask to form an ohm contact layer 15 and an active layer 14 as illustrated in FIG. 3I.

The sixth step is to form a passivation layer 18 on the pixel electrode 17 as illustrated in FIG. 2.

The method for fabricating an array substrate according to a second embodiment of this disclosure further includes: forming a common electrode on the passivation layer.

Based upon the same inventive idea, an embodiment of this disclosure further provides a display panel including the array substrate according to any one of the embodiments of this disclosure.

Based upon the same inventive idea, an embodiment of this disclosure further provides a display device including the display panel according to the embodiment of this disclosure. The display device can be a display panel of a mobile phone, a tablet computer, a TV set, a monitor, a notebook computer, a digital photo frame, a navigator, or any other product with a display function.

In summary, in the technical solutions according to the embodiments of this disclosure, the first photo-resist layer is stripped in a changed order in that the first photo-resist layer on the source-drain is stripped through wet etching before the ohm contact layer film and the active layer film are etched in the electrically-conductive channel area (i.e., an electrically-conductive channel of a TFT is etched) to form the ohm contact layer and the active layer, so that the electrically-conductive channel area is formed after stripping through wet etching to thereby avoid Cu ions from contaminating the electrically-conductive channel area of the TFT during stripping through wet etching. Furthermore as compared with stripping the first photo-resist layer on the source-drain through dry etching, the production throughput can be improved, and the surface of the Cu film at the interface between the source-drain and the pixel electrode can be avoided from being oxidized.

Evidently those skilled in the art can make various modifications and variations to this disclosure without departing from the spirit and scope of this disclosure. Thus the disclosure is also intended to encompass these modifications and variations thereto so long as the modifications and variations come into the scope of the claims appended to this disclosure and their equivalents.

The invention claimed is:

1. A method for fabricating an array substrate, the method comprising:
   forming a gate, a gate insulation layer, an active layer film, an ohm contact layer film, and a Cu layer on a base successively;
   forming a first photo-resist layer on the Cu layer, and patterning the first photo-resist layer to form a first photo-resist pattern;
   etching the Cu layer, the ohm contact layer film, and the active layer film using the first photo-resist pattern to form a source-drain at the Cu layer, and to remove patterns other than patterns corresponding to the source-drain and an electrically-conductive channel area, at the ohm contact layer film and the active layer film;
   stripping the first photo-resist layer through a wet etching;
   forming a pixel electrode in partial contact with the source-drain from which the first photo-resist layer is stripped, on the source-drain; and
   etching the ohm contact layer film and the active layer film in the electrically-conductive channel area by using the source-drain as a shelter, to form an ohm contact layer and an active layer.

2. The method according to claim 1, wherein the etching the Cu layer, the ohm contact layer film, and the active layer film using the first photo-resist pattern comprises:
   performing a first wet etching on the Cu layer by using the first photo-resist pattern as a shelter, to remove the pattern other than patterns corresponding to the source-drain and the electrically-conductive channel area, at the Cu layer;
   performing a first dry etching on the ohm contact layer film and the active layer film by using the first photo-resist pattern as a shelter, to remove the patterns other than patterns corresponding to the source-drain and the electrically-conductive channel area, at the ohm contact layer film and the active layer film;
   thinning the first photo-resist pattern to remove the first photo-resist pattern in the electrically-conductive channel area; and
   performing a second wet etching on the Cu layer by using thinned first photo-resist pattern as a shelter, to remove the pattern of the Cu layer corresponding to the electrically-conductive channel area to form the source-drain.

3. The method according to claim 2, wherein the etching the ohm contact layer film and the active layer film in the electrically-conductive channel area comprises:
   performing a second dry etching on the ohm contact layer film and the active layer film to remove the patterns other than patterns corresponding to the electrically-conductive channel area, at the ohm contact layer film and the active layer film.

4. The method according to claim 1, wherein the forming the pixel electrode in partial contact with the source-drain from which the first photo-resist layer is stripped, on the source-drain comprises:
   forming a transparent electrode layer on the source-drain from which the first photo-resist layer is stripped;
   forming a second photo-resist layer on the transparent electrode layer, and patterning the second photo-resist layer to form a second photo-resist pattern;
   etching the transparent electrode layer using the second photo-resist layer to form a pixel electrode; and
   stripping the second photo-resist layer on the pixel electrode.

5. The method according to claim 1, wherein after the ohm contact layer and the active layer are formed, the method further comprises:
   forming a passivation layer on the pixel electrode.

6. The method according to claim 5, further comprises:
   forming a common electrode on the passivation layer.

7. The method according to claim 1, wherein before the gate is formed, the method further comprises:
   forming a common electrode on the base substrate.

* * * * *